United States Patent [19]
Jones et al.

[11] Patent Number: 5,920,808
[45] Date of Patent: Jul. 6, 1999

[54] METHOD AND APPARATUS FOR REDUCING KEY-UP DISTORTION BY PRE-HEATING TRANSISTORS

[75] Inventors: David E. Jones, Quincy, Ill.; Mark A. Walker, Palmyra, Mo.; Thomas L. Frederick, Liberty, Ill.; Kevin P. Murphy, Palmyra, Mo.; Gerald D. Deters, Quincy, Ill.

[73] Assignee: Glenayre Electronics, Inc., Charlotte, N.C.

[21] Appl. No.: 08/764,798

[22] Filed: Dec. 12, 1996

[51] Int. Cl.$^6$ ........................................... H04M 7/32
[52] U.S. Cl. ........................... 455/127; 455/126; 455/63; 455/67.3; 455/296
[58] Field of Search .................... 455/126, 127, 455/67.3, 63, 296, 115, 116, 331; 330/289

[56] References Cited

U.S. PATENT DOCUMENTS

| | | | |
|---|---|---|---|
| 4,317,083 | 2/1982 | Boyd | 455/127 |
| 4,654,672 | 3/1987 | Bailey et al. | 455/127 |
| 5,406,225 | 4/1995 | Iida et al. | 455/127 |

Primary Examiner—Wellington Chin
Assistant Examiner—Keith Ferguson
Attorney, Agent, or Firm—Christensen O'Connor Johnson & Kindness PLLC

[57] ABSTRACT

A biasing circuit for a power amplifier, for use in a transmitter, that substantially reduces distortion during key-up and thereby reduces key-up time. The power amplifier includes an output transistor and a bias circuit. The bias circuit is applied to all the class AB stages of the power amplifier. The bias circuit provides to the output transistor a first bias level during the preheat period and a second bias level during the transmit period. This first bias level is predetermined to cause the output transistor to reach the steady-state junction temperature achieved by the output transistor during the transmit period (i.e., when transmitting output signals biased with the second bias level). The preheat period ends when this steady-state temperature is reached. Thus, the power amplifier can then transition to a transmit period having already reached the steady-state junction temperature. Because the output transistor is already heated to the steady-state junction temperature, "thermal" distortion (i.e., the distortion incurred when the output transistor's junction temperature changes while transmitting) is avoided and the key-up time is reduced.

23 Claims, 9 Drawing Sheets

METHOD AND APPARATUS FOR REDUCING KEY-UP DISTORTION BY PREHEATING TRANSISTORS

FIELD OF THE INVENTION

The present invention relates to linear transmitters utilizing predistortion and, more particularly, to linear transmitter key-up schemes. Still more particularly, the present invention relates to systems for reducing both the key-up period and distortion during key-up.

BACKGROUND

Generally, broadcast transmitters such as those used in broadcasting radio frequency signals, when initially turned on (commonly referred to as "key-up"), behave differently compared to when the transmitter has been transmitting for a significant period of time. The primary reason for the variation in behavior is the change in temperature in the output transistors of the transmitter's power amplifier. Immediately following key-up, the power amplifier's output transistors typically are at room temperature. In contrast, with the transmitter transmitting after key-up, the output transistors heat up and reach a steady-state junction temperature of up to 200° C. or more, when the transistors have appropriate heat dissipation mechanisms (e.g., heat sinks and/or fans). During this transistor "warm-up" period, the changing junction temperature of the output transistors generally affects the behavior of the power amplifier. However, the power amplifier's behavior is substantially predictable once the steady-state junction temperature is reached. Typically, the power amplifier's output transistors require about five to six hundred milliseconds to warm up to steady state junction temperature after key-up.

The transistor warm-up period following key-up can be problematic in that the different behavior during key-up can cause distortion of the transmitter output signal if the transmitter transmits during this period (referred to herein as the key-up period). In particular, for transmitters using predistortion linearization schemes, the key-up period behavior tends to be difficult for the predistortion algorithm to match. Consequently, during the key-up period, the linear transmitter's output signal is distorted. In addition, if the transmitter uses a training scheme to update the predistortion, the transmitter may undesirably train on abnormally distorted output signals during the key-up period. Conventional transmitters with "backed-off" power amplifiers may avoid key-up distortion, but at the cost of lower efficiency.

Moreover, in paging system applications, the distortions may cause the output signal to undesirably exceed Federal Communications Commission (FCC) adjacent channel emission limits (i.e., the output signal may have components with frequencies that are outside the assigned frequency band). To avoid transmitting distorted data that may cause reception errors, conventional paging system transmitters may transmit dummy data during the key-up period. However, the key-up period distortions may exceed the FCC limits and degrade the performance of these adjacent channels. Other conventional transmitters may transmit an unmodulated carrier signal during the key-up period, which does not produce adjacent channel emissions. In either of these implementations, no useful data is being transmitted during the key-up period, thereby undesirably reducing the transmitter's throughput. Accordingly, there is a need for a practical transmitter system that reduces both the key-up period distortion and the key-up time period.

SUMMARY

In accordance with the present invention, a power amplifier for use in a transmitter is configured to have a preheat period and a transmit period (i.e., a period during which the transmitter is transmitting). In one embodiment, the power amplifier includes an output transistor and a bias circuit. The bias circuit provides to the output transistor a first bias level during the preheat period and a second bias level during the transmit period. This first bias level is predetermined to cause the output transistor to reach the steady-state junction temperature achieved by the output transistor during the transmit period (i.e., when transmitting output signals biased with the second bias level). The preheat period ends when this steady-state temperature is reached. Thus, the power amplifier can then transition to a transmit period having already reached the steady-state junction temperature. Because the output transistor is already heated to the steady-state junction temperature, "thermal" distortion (i.e., the distortion incurred when the output transistor's junction temperature changes while transmitting) is avoided. In this embodiment, the preheat period is started so that this steady-state temperature is reached by the start of a transmit phase. Consequently, the DC preheating not only substantially eliminates thermal distortion of the transmitted output signals, but also avoids the need for a key-up period, thereby increasing the transmitter's throughput.

Another embodiment of the invention is adapted for use as a transmitter. Before transmitting a signal, the transmitter enters a preheat period. The transmitter then transitions to a transmit phase during which the transmitter transmits the signal. The transmitter includes a modulator, a predistorter, a power amplifier, and a trainer. The modulator receives an input signal and outputs a modulated carrier signal dependent on the input signal. The predistorter is coupled to the modulator and outputs a predistorted signal dependent on the modulated carrier signal. The power amplifier is coupled to the predistorter and outputs an amplified signal dependent on the predistorted signal.

The power amplifier has a bias circuit and output transistor. The bias circuit provides a first bias level to the output transistor when said transmitter is operating in the preheat period. The bias circuit provides a second bias level when the transmitter is transmitting an output signal in the transmit period. By the end of the preheat period, the first bias level causes the output transistor to reach the steady-state junction temperature that the output transistor achieves under the second bias level while the transmitter is transmitting. Then when the transmitter transitions to the transmit period, the output transistor is already at the steady-state junction temperature.

The trainer is coupled to the power amplifier and provides to the predistorter a training signal dependent on the amplified signal from said power amplifier. The training signals configure the predistorter to introduce distortion to the modulated signal that substantially cancels the distortion introduced by the power amplifier.

Because the output transistor is at the steady-state junction temperature at the start of the transmit period, the transmitter has no key-up period. Thus, the transmitter avoids transmitting output signals with thermal distortion and increases throughput.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
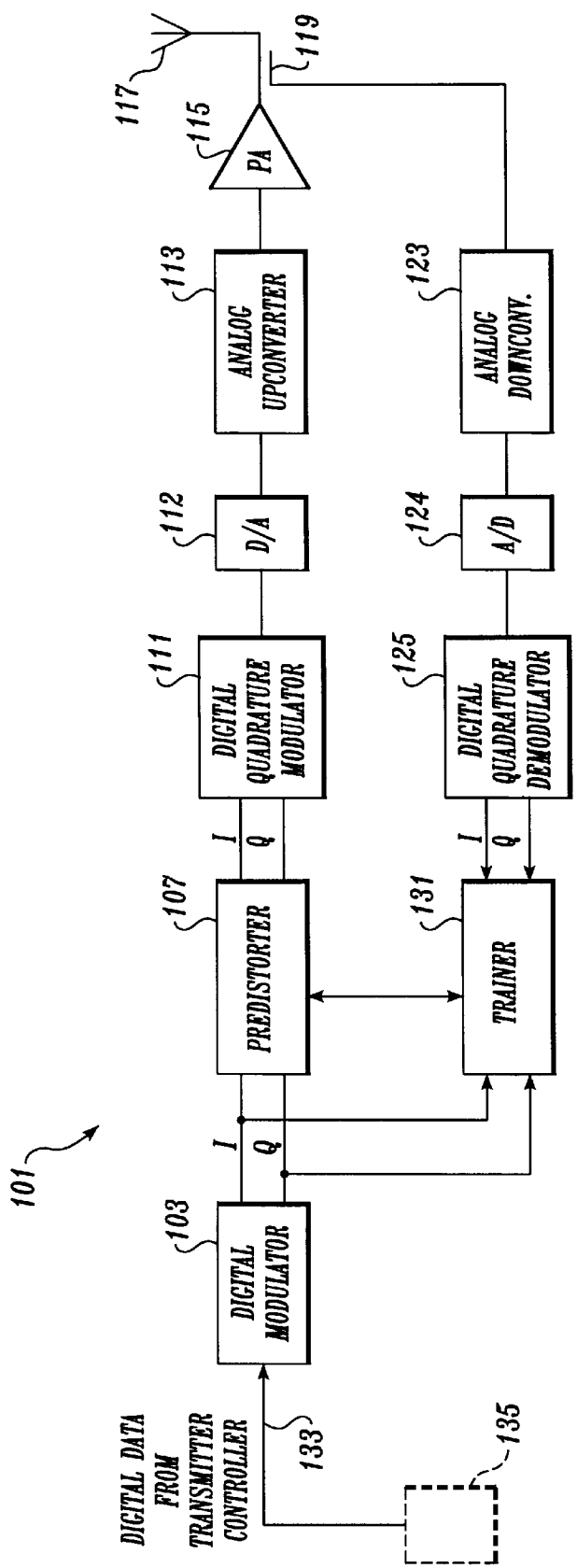
FIG. 1 is a simplified block diagram of one embodiment of a transmitter according to the present invention.

FIG. 1 shows in schematic form one embodiment of a linear transmitter 101 in accordance with the present invention. In the forward signal processing path, the transmitter 101 includes a modulator 103, a predistorter 107, a digital quadrature modulator 111, a digital-to-analog converter 112, an analog upconverter 113, a power amplifier 115 and a transmitting antenna 117. A feedback loop of the transmitter includes a directional coupler 119 (between the power amplifier 115 and the antenna 117), an analog downconverter 123, an analog-to-digital converter 124, a digital quadrature demodulator 125, and a trainer 131. The trainer is coupled to receive the output signals of the digital modulator 103 and interact with the predistorter 107. In other embodiments, additional power amplifiers may be connected in parallel with the power amplifier 115 to increase the gain of the transmitter 101.

Consistent and predictable performance of the transistors, and thus, the power amplifier, of a transmitter is crucial, particularly for the new linear transmitters used for broadcasting modulation schemes that rely upon both amplitude and phase modulation. An example of a linear transmitter is detailed in co-pending, co-assigned U.S. patent application Ser. No. 08/601,118 filed Feb. 14, 1996, entitled "Linear Transmitter Using Predistortion", which is incorporated by reference herein. Digital data that is to be broadcast by the transmitter 101 is provided to the modulator 103, as represented by line 133. The data may be provided by any source. In the preferred embodiment, the linear transmitter 101 is adapted for use as a paging transmitter, although it can be used in any radio frequency (RF) application. In the preferred embodiment, the data input into the modulator 103 is provided from a transmitter controller 135 (shown in broken lines) that is operative to receive data over a link channel from a paging terminal and formulate the data for transmission. The details of the construction of a transmitter controller, and indeed an entire paging system, can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated by reference herein.

In the preferred embodiment, the data is a series of digital symbols, with each symbol representing a predetermined number of bits. The number of bits per symbol is dependent upon the particular modulation scheme being transmitted by the transmitter 101. Modulation formats in typical conventional paging data systems include formats such as, for example, two or four tone frequency shift keying (FSK) modulation and QAM. QAM formats include, for example, an eight level QAM modulation scheme that would have a three-bit symbol. Similarly, a sixteen level QAM scheme would have four bits per symbol. It can be appreciated that for a three-bit symbol, there are eight possible symbols. Likewise, for a four-bit symbol, there are sixteen possible symbols. Throughout most of this discussion, the example used will be of a four-bit symbol, which corresponds to a sixteen level QAM scheme.

The modulator 103 is operative to correlate each particular symbol with predetermined in-phase and quadrature output signals. Thus, for each unique symbol, a different combination of in-phase and quadrature component signals for the base band signal is output by the modulator. In the preferred embodiment, the modulator 103 includes a Texas Instruments TMS320C44 microprocessor that is programmed to perform the in-phase and quadrature modulation on the symbols (described below in conjunction with FIGS. 3 and 4).

Additionally, as each symbol is processed, the modulator 103 does not "instantaneously" transition from one symbol to another. Such an instantaneous change in in-phase and quadrature output signals would result in high frequency harmonics in the system. Instead, by means of digital filtering, a smooth transition between symbols (and therefore in-phase and quadrature output signals) is achieved. One embodiment of this technique which is applicable to a FSK system is disclosed in more detail in U.S. Pat. No. 5,418,818 to Marchetto et al., assigned to the same assignee as the present invention and incorporated herein by reference.

Next, the in-phase and quadrature component signals output by the modulator 103 are input into the predistorter 107. The predistorter 107 is operative to modify the in-phase and quadrature component signals output from the modulator 103 so as to compensate for any distortion that takes place in the power amplifier 115. The compensation provided by the predistorter 107 is controlled by the trainer 131 using any suitable predistortion scheme. The trainer 131 is described in more detail below.

The output of the predistorter 107 is then provided to the digital quadrature modulator 111. The digital quadrature modulator 111 converts the in-phase and quadrature component signals into a single real digital signal. The real digital signal from the digital quadrature modulator 111 is received by a D-A converter 112 that converts the real digital signal to an analog signal, producing an intermediate frequency output signal. For example, the intermediate frequency is approximately 5.6 MHz in a representative embodiment. Because a single D-A converter is used, the distortion caused by the relative delay and amplitude differences introduced in those conventional systems that use separate D-A converters for in-phase and quadrature signals is substantially eliminated in the transmitter 101.

The intermediate frequency output signal from the D-A converter 112 is provided to the analog upconverter 113, which converts the intermediate frequency signal to a broadcast frequency signal having a frequency within a frequency band of the paging system. For example, the broadcast frequency is approximately 940 MHz in a representative embodiment. The analog upconverter 113 can be any suitable conventional upconverter such as, for example, a mixer receiving a local oscillator signal.

The power amplifier 115 receives the broadcast frequency signal from the analog upconverter 113, amplifies the signal, and provides the amplified signal to the transmitting antenna 117 for transmission. One embodiment of the power amplifier 115 is described below in conjunction with FIGS. 9 and 10. In a representative embodiment, four such power amplifiers are used in parallel, but fewer or more can be used in other configurations. In accordance with the present invention, the power amplifier 115 includes a bias circuit and output transistor which operate to substantially eliminate both the thermal distortion of the power amplifier's output signals and the key-up period of conventional transmitters. More specifically, before transmitting a signal, the transmitter enters a preheat period during which the bias circuit is operative to bias the output transistor to conduct a predetermined DC current to heat up the output transistor to have a junction temperature substantially equal to the output transistor's steady-state junction temperature resulting from transmission of real data. The transmitter then transitions to a transmit phase in which the power amplifier amplifies an RF signal containing real data to be transmitted. Because the output transistor is already at the desired steady-state junction temperature at the start of the transmit period, the amplified signal has substantially no thermal distortion, thereby eliminating the key-up period and the need for transmitting dummy data or an unmodulated carrier signal. In addition, the power amplifier 115 enables the transmitter 101 to avoid transmitting signals during the key-up period while still reducing the key-up time. Accordingly, compared to conventional transmitters, the transmitter 101 has an increased throughput due to the reduction of the key-up period while, in addition, substantially eliminating the transmission of thermally distorted signals.

An alternative solution to reducing key-up distortion is to have the transmitter transmit dummy data during the key-up period to a dummy load. The dummy data is not broadcast through an antenna, but instead is directed to some power dissipation circuit such as a bank of resistors. This scheme allows the transmitter to "warm up" during the key-up period without broadcasting thermally distorted output signals that may be out of the desired frequency band. However, this solution may not be practical for high power applications. For example, a transmitter in a paging system may be required to transmit signals of five hundred watts or more, which would require a large and costly dummy load. Further, the switch required to redirect the energy provided by the power amplifier output transistors from the antenna to the dummy load must be able to handle the power levels involved and operate quickly to minimize the time delay before the transmitter can broadcast real data. Thus, the switch would also be large and costly. Further, because this solution prevents the transmitter from transmitting real data during the key-up period, the throughput of the system remains the same as the aforementioned conventional transmitters. This "low" throughput problem may be acute for some advanced paging protocols, in which the transmitter may be "keyed-up" several times each minute.

In order to aid in the accurate predistortion of the signal, the feedback loop monitors the amplified signal from the power amplifier 115. In the preferred embodiment, the coupler 119 is a conventional directional coupler positioned relatively close to the antenna 117. The signal from the coupler 119 is provided to the analog downconverter 123.

The analog downconverter 123 operates in an opposite manner to the analog upconverter 113. In particular, the analog downconverter 123 lowers the frequency of the receive signal outputted by power amplifier 115 to an intermediate frequency. In the preferred embodiment, this intermediate frequency is substantially the same as the intermediate frequency used in the forward signal processing path. Within the analog downconverter 123, there is a series of filtering, amplification, and mixing with local oscillator signals to generate the intermediate frequency signal.

Next, the intermediate frequency signal is converted from an analog intermediate frequency signal into a digital signal. This is accomplished by using a conventional A-D converter 124 such as, for example, an Analog Devices AD9026, which samples the intermediate frequency signal and outputs a digital signal representing the sampled intermediate frequency signal. The digital quadrature demodulator 125 performs a digital quadrature demodulation of the digital signals and outputs the in-phase component signal and the quadrature component signal.

The trainer 131 receives the output signals of the digital quadrature demodulator 125. The trainer 131 also receives the output signals from the modulator 103. Some predistortion algorithms also require the trainer 131 to receive the output signals from the predistorter 107. Thus, in effect, the trainer 131 receives the exact modulated signal that was intended to be sent (the output signals of the modulator 103) and the signal that was transmitted (the output signals of the digital quadrature demodulator 125) in order to ensure that the predistorter 107 correctly compensates for the distortion caused by the power amplifier 115. The trainer 131 and the predistorter 107 can implement any suitable predistortion scheme such as, for example, the scheme disclosed in U.S. Pat. No. 5,049,832 to Cavers. Typically, the trainer provides one or more "trainer" signals to the predistorter that modify the predistorter's response to the in-phase and quadrature signals input to the predistorter.

In addition, the trainer monitors the actual data or voice signals being transmitted to implement the predistortion scheme, as opposed to special sequences (i.e., not normal data or voice signals) as required by some conventional systems. Thus, normal data or voice transmissions need not be interrupted to transmit special data sequences to update the predistorter as in these conventional systems.

Figure 2:
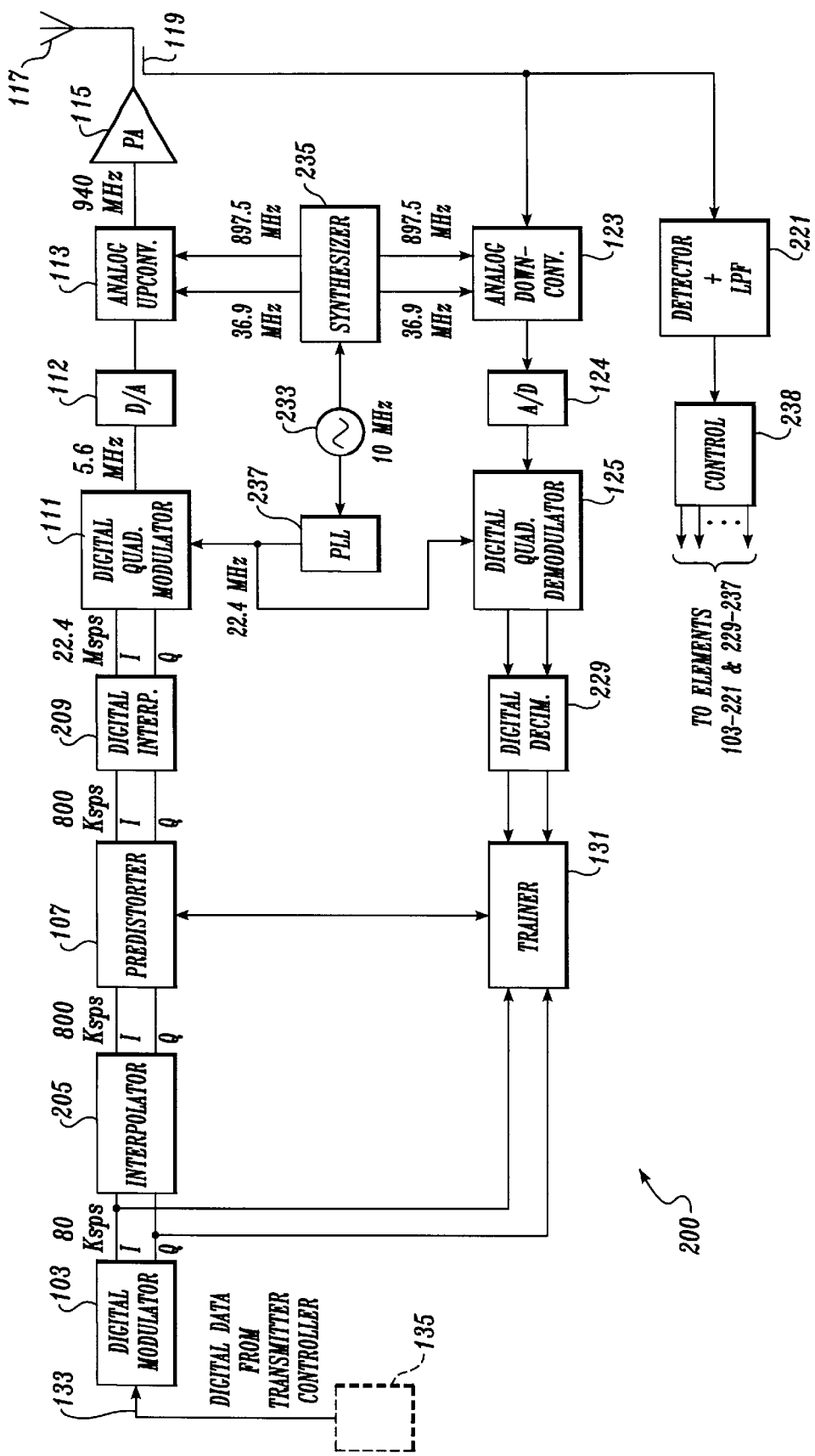
FIG. 2 is a block diagram of a second embodiment of a transmitter according to the present invention.

FIG. 2 is a block diagram of a transmitter 200 according to another embodiment of the present invention. The transmitter 200 is substantially similar to the transmitter 101 (FIG. 1), except that the transmitter 200 includes an interpolator 205 connected between the modulator 103 and the predistorter 107, a digital interpolator 209 connected between the predistorter 107 and the digital quadrature modulator 111, a digital decimator 229 connected between the trainer 131 and the digital quadrature demodulator 125, a combined detector and low pass filter 221 connected to the coupler 119, and a controller 238 connected to the detector and low pass filter 221. The output signals of the controller 238 are provided to components 103–221 and 229–237 as described below. In addition, the transmitter 200 includes a synthesizer 235 connected to the analog upconverter 113 and the analog downconverter 123, a phase locked loop (PLL) 237 connected to the digital quadrature modulator 111. An ovenized reference oscillator 233 is connected to both the synthesizer 235 and the PLL 237.

The transmitter 200 operates in substantially the same manner as the transmitter 101 (FIG. 1). In this embodiment, the output signals of the modulator 103 are the in-phase and quadrature component signals sampled at 80,000 samples per second (80 ksps). The preferred embodiment of the modulator 103 is described below in conjunction with FIG. 3.

The in-phase and quadrature component signals output by the modulator 103 are received by the interpolator 205. The interpolator 205 operates to increase the effective sampling rate of the received signals by means of digital interpolation. In the preferred embodiment, the interpolator 205 outputs the in-phase and quadrature component signals at a rate of approximately 800 ksps and is implemented with a DSP module (described below in conjunction with FIG. 4).

Next, the signals output from the interpolator 205 are input into the predistorter. The predistorter 107, as previously described, predistorts the received in-phase and quadrature component signals to compensate for the distortion of the power amplifier 115. The predistorted 800 ksps component signals from the predistorter 107 are received by the digital interpolator 209. The digital interpolator 209 operates in a fashion similar to the interpolator 205. In particular, the digital interpolator 209 converts the sampling rate to a higher rate. Specifically, both the in-phase and quadrature component signals are first upconverted in a first step by a factor of two. Thus, after this first conversion, the effective sampling rate of the component signals is approximately 1.6 Msps. The signals are then upconverted by another factor of two, resulting in an effective rate of approximately 3.2 Msps. Next, these two 3.2 Msps signals are passed to a further interpolator which upconverts them by a factor of seven to approximately 22.4 Msps. Thus, the output signals of the digital interpolator 209 are in-phase and quadrature component signals that have been sampled at 22.4 Msps. The interpolation stages include digital filtering of the base band signals. The implementation of the digital interpolator 209 is described further below in conjunction with FIG. 5.

The digital quadrature modulator 111 receives the output signals of the digital interpolator 209 and modulates them as previously described using a digital quadrature modulation scheme. In this embodiment, the digital quadrature modulator 111 uses a digital equivalent of a conventional double balanced modulation scheme in conjunction with a 5.6 MHz carrier signal derived from a 22.4 MHz signal provided by the PLL 237. The real digital modulated output signal is then converted to an analog signal by the D-A converter 112. As a result, the D-A converter 112 outputs a 5.6 MHz analog intermediate frequency signal to the analog upconverter 113.

The analog upconverter 113 receives two local oscillator signals provided by the synthesizer 235. In the preferred embodiment, where the broadcast frequency is 940 MHz, the two frequencies provided by the synthesizer 235 are a 36.9 MHz local oscillator signal and a 897.5 MHz local oscillator signal. The analog upconverter 113 receives the local oscillator signals for mixing with the 5.6 MHz intermediate frequency signal in a conventional two-stage mixing scheme. In the first stage of the upconversion, the intermediate signal is mixed with the 36.9 MHz local oscillator signal, and the upper side band of the resulting 42.5 MHz signal is amplified and bandpass filtered before being mixed with the 897.5 MHz local oscillator signal. The resulting upper side band at 940 MHz is bandpass filtered and provided to the power amplifier 115. It can be appreciated that to change the frequency of transmission of the transmitter 101, the local oscillator frequencies of synthesizer 235 can be changed. The 940 MHz signal is then amplified by the power amplifier 115 and broadcast through antenna 117 as previously described for transmitter 101 (FIG. 1).

In the preferred embodiment, the synthesizer 235 is a Phillips SA7025 synthesizer chip. As noted above, the synthesizer 235 controls the variable local oscillator signal for precisely determining the transmit frequency of the signal. The synthesizer 235 uses a reference oscillator 233 that, in the preferred embodiment, is a stable reference at 10 MHz. In the preferred embodiment, this 10 MHz stable reference is obtained from the transmitter controller of a paging base station.

The analog upconverter 113 also includes a conventional variable attenuator which can be controlled by the controller 238. The variable attenuator can be any suitable variable attenuator such as, for example, a PIN diode attenuator. Likewise, the analog downconverter 123 also includes a conventional variable gain amplifier such as, for example, a model AD603 amplifier from Analog Devices. The gain of this amplifier is controlled by the controller 238. The controller 238 is described further below in conjunction with FIG. 6. As a result, the controller 238 can maintain substantially constant power amplifier output power, as described below in conjunction with the flow diagram depicted in FIG. 7.

The controller 238 also provides a preheat control signal to the power amplifier 115. The controller 238 asserts the preheat control signal to start the preheat period when the controller 238 receives a message from the modulator 103 indicating a message is to be transmitted. As described above in conjunction with FIG. 1, during the preheat period, the power amplifier 115 is configured to provide the first bias level, causing the power amplifier's output transistor to conduct a predetermined DC current. This DC current causes the output transistor to heat up so that the output transistor's junction temperature is substantially equal to the predetermined steady-state junction temperature while the transmitter is transmitting during a transmit period. Preferably, the controller 238 initiates the preheat period while the transmitter 200 is processing the message for transmission so that the preheating and the message processing occur about concurrently. Ideally, the preheat period is completed just as the message processing is completed so that the transmit period can be started to broadcast the message without additional delay, thereby optimizing the transmitter's throughput. After the transition from the preheat period to the transmit period, the controller 238 then configures the power amplifier 115 to provide the second bias level. The second bias level is chosen to optimize the performance of the output transistor under normal transmitting operation.

In the average power monitoring path, the combined detector and low pass filter 221 measures the average signal strength and provides a signal indicative of the average signal strength to the controller 238. The detector 221 can be any suitable average power detector such as, for example, a conventional calibrated diode detector. The controller 238 also receives input signals from the modulator 103 and from the digital decimator 229. By analyzing the signals received from these sources, the controller 238 can determine if any of the system components are malfunctioning. For example, if the output signal of the detector 221 indicates a drop in average signal strength, and the output signals of the modulator 103 remain relatively constant, then a malfunction in the upconversion chain (103–119) is indicated. The detector 221 and controller 238 can also be used to monitor and calibrate the gain of the power amplifier 115.

Referring back to the feedback path, as described above, the 940 MHz receive signal from the coupler 119 is provided to the analog downconverter 123, converted to the intermediate frequency of 5.6 MHz, and received by the digital quadrature demodulator 125. The digital quadrature demodulator 125 operates as previously described for the transmitter 101 (FIG. 1), producing in-phase and quadrature component signals at 22.4 Msps. In the preferred embodiment, the digital quadrature demodulator is implemented using a Xilinx 4003 field programmable gate array (FPGA) that has been configured to perform the digital quadrature demodulation.

The digital decimator 229 receives the output signals of the digital quadrature demodulator 125 and performs a decimation by a factor of twenty-eight to produce 800 ksps complex base band signals. The downconversion is performed, in the preferred embodiment, by two Harris HSP43220 decimating filter chips programmed to decimate by twenty-eight and to filter the base band signals.

The 800 ksps complex base band signals are received by the trainer 131. As previously described, the trainer analyzes the receive signals and the signals from the modulator 103 to control the predistorter 107 to properly compensate for the distortion caused by the power amplifier 115. The output signals of the predistorter 107 may be received by the trainer 131 as required by the particular predistortion scheme being used.

Another important feature of the present invention is that all of the processing done by each of the components of FIG. 2 is keyed off synchronous clock signals. By utilizing the same clocking in the demodulation scheme of components 123–131 and 205–209, as is used in the modulation scheme of components 103–113 and 229, it is possible to monitor the transmitted signal quality on each digital sample. The modulation and demodulation are phase locked to one another with adjustment only needed for the delay through the analog and digital stages, including the power amplifier 115.

Figure 3:
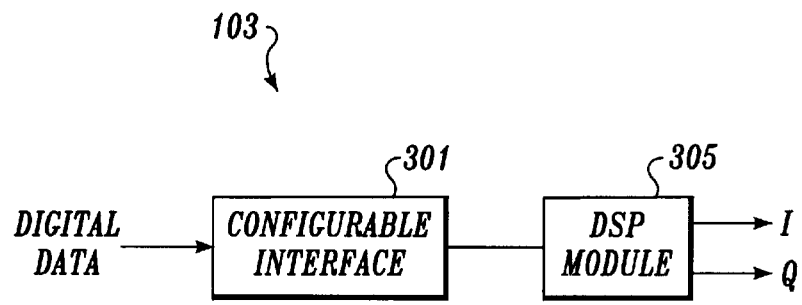
FIG. 3 is a block diagram of one embodiment of a modulator according to the present invention.

FIG. 3 is a block diagram of one embodiment of the modulator 103 according to the present invention. The modulator 103 includes a configurable interface 301, implemented with a reprogrammable logic device, to receive digital signals from the transmitter controller 135 (FIG. 2). In the preferred embodiment, the reprogrammable logic device is a Xilinx XC4003 field programmable gate array (FPGA), although any suitable reprogrammable logic device can be used. As a result, the configurable interface 301 can be configured to operate with various transmitter controllers. The configurable interface 301 is connected to the DSP module 305 (described below in conjunction with FIG. 4), which receives real digital signals from the interface 301 and converts them into filtered complex digital signals. The DSP module 305 is programmed to produce the in-phase and quadrature component signals from the digital signal received by the configurable interface 301. Additional DSP modules substantially similar to DSP module 305 in hardware implementation may be used to implement a more complex modulation algorithm or to increase the speed of the modulator.

Further, the digital modulator 103 may be programmed to delay incoming signals from the transmitter controller 135 (FIG. 2) for use in a transmitter system using one or more transmitters in addition to the transmitter 200 (FIG. 2) to transmit the data signals. This programmed delay is adjusted so that the transmitter 200 will transmit the data signals at substantially the same time as other transmitters that are transmitting the same data signals. This delay scheme is described further in the aforementioned Marchetto patent.

In addition, the digital modulator 103 can be programmed to equalize processing delays within the digital modulator itself that arise when the modulation format is changed. For example, the processing delays within the digital modulator for FSK modulation and for AM single sideband (SSB) voice modulation are different. Consequently, for example, when a first set or packet of data signals are modulated using a relatively slow modulation processing format, followed by a second set of data signals using a relatively fast modulation processing format, the digital modulator 103 may experience a fault as the "fast" data overtakes the "slow" data. This delay scheme is also described further in the Marchetto patent.

Figure 4:
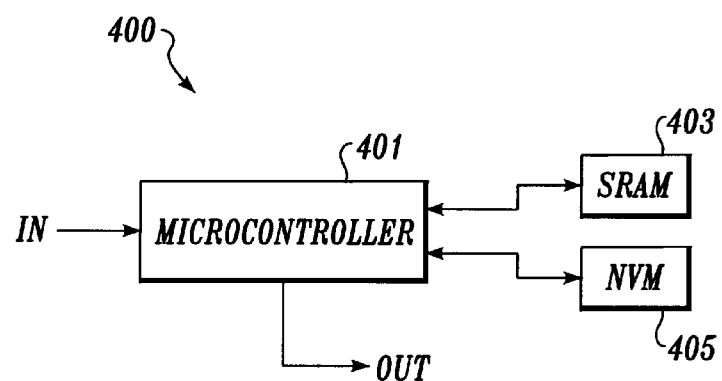
FIG. 4 is a block diagram of one embodiment of a DSP module according to the present invention.

FIG. 4 is a block diagram of one embodiment of a DSP module 400 according to the present invention, substantially identical to DSP module 305 (FIG. 3) in hardware implementation. The DSP module 400 includes a microprocessor 401. In the preferred embodiment, the microprocessor 401 includes a DSP microprocessor TMS320C44 available from Texas Instruments, although any suitable microprocessor can be used. The microprocessor 401 is connected to a static random access memory (SRAM) 403 and a nonvolatile memory 405. In this embodiment, the nonvolatile memory 405 is implemented using a flash electrically programmable read only memory (EPROM). As a result, the DSP module 400 can be configured or programmed for a variety of functions, such as, for example, forming part of a modulator, interpolator, trainer or predistorter. Further, the DSP module 400 can be reprogrammed to change its functionality through the controller 238, which can be programmed to replace the configuration program stored in the nonvolatile memory 405.

In addition, when the trainer 131 and the predistorter 107 are implemented with DSP modules, the DSP modules can be programmed to maintain the maximum dynamic range in the digital signals passing through the D-A and A-D converters in the transmitter 200 (FIG. 2). Maximizing the dynamic range helps maximize the signal-to-noise ratio of the signals passed through the transmitter. However, if the dynamic range is exceeded, the transmitter suffers severe performance degradation. In the D-A converter, exceeding the dynamic range causes so called "wrap-around" of the output analog signal. Thus, for example, when the D-A converter receives a maximum amplitude signal that exceeds the dynamic range, the digital signal detected by the D-A converter will "wrap-around" to a value near the minimum value, causing the analog output signal have a very small amplitude. Similarly, a minimum value signal exceeding the dynamic range will result in an analog output signal at near the maximum amplitude. In the A-D converter, exceeding the dynamic range will result in clipping of high amplitude signals. The predistorter can be programmed to maintain a maximal dynamic range as described in more detail below in conjunction with FIG. 8.

Still further, the DSP module 400 can be remotely reconfigured by remotely communicating reconfiguration information to the controller 238 (FIG. 2). For example, the controller 238 includes a port that can be coupled to an external communication means, such as a modem coupled to a telephone line. Thus, the controller 238 can receive reconfiguration information transmitted over the telephone lines and send this information to the DSP module to be stored in the nonvolatile memory 405. Of course, in other embodiments the controller 238 can remotely receive the configuration information through other remote communication schemes. Thus, in the preferred embodiment, DSP modules substantially similar to the DSP module 400 are used to implement the trainer 131 and predistorter 107 (FIG. 2) so that they can be subsequently reconfigured with updated predistortion algorithms. In addition, this embodiment of the trainer 131 can be programmed so that the trainer 131 can perform a fast Fourier transform (FFT) of the 800 ksps complex baseband signals received from the digital decimator 229, thereby producing the spectrum of baseband signals.

Moreover, the DSP module implementing the trainer can also be programmed to compare this spectrum to a mask or envelope of the maximum allowed out-of-band signal levels. If the out-of-band signal levels exceed the maximum allowed, then the DSP module can cause a transmitter disable and reset either directly or by signaling the controller 238 (FIG. 2) to force a shutdown and reset of the transmitter. In FSK embodiments, the trainer can be programmed to monitor the magnitude of the envelope of the transmitted signal. FSK modulation has a constant envelope and, thus, the sum of the squares of the in-phase and quadrature amplitudes of each sample should be equal to the same value. The trainer can be programmed to indicate a fault to the controller 238 when the envelope is not constant.

Further, when implementing the predistorter with a DSP module 400, the predistorter can, on powerdown, store the predistortion values in the nonvolatile memory 405. As a result, the predistorter can use these stored values immediately after power up to predistort data to be transmitted. Thus, the predistorter does not require a special initialization process with special training sequences as required in many conventional systems.

Figure 5:
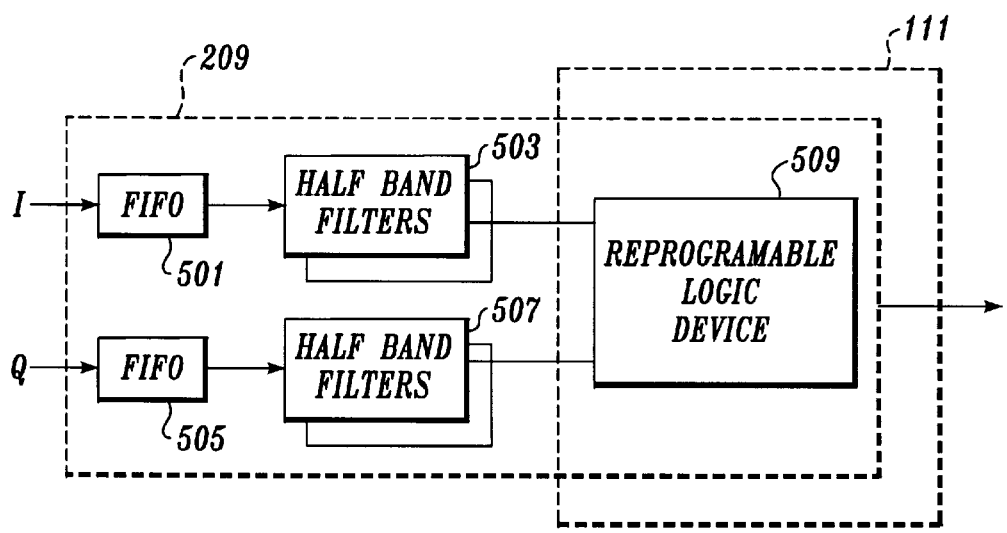
FIG. 5 is a block diagram of one embodiment of a digital interpolator and digital quadrature modulator according to the present invention.

FIG. 5 is a block diagram of one embodiment of the digital interpolator 209 and the digital quadrature modulator 111 according to the present invention. The digital upconverter receives the complex signals from the predistorter 107 (FIG. 2) in FIFOs 501 and 505, which feed two pairs of half band filters 503 and 507. In the preferred embodiment, the two pairs of half band interpolation filters are used to accomplish part of the upconversion from 800 ksps to 3.2 Msps are two pairs of Harris HSP43216 half-band filters, which feed a seven-times interpolator. The seven-times interpolator is implemented by reprogrammable logic device 509 which, in the preferred embodiment, is a Xilinx 4010 FPGA implementing a cascaded integrator/comb (CIC) filter. In addition, the reprogrammable logic device 509 also implements the digital quadrature modulator 111. The D-A converter 112 receives the output signals of the digital quadrature modulator 111 and outputs a real analog intermediate frequency signal corresponding to the real digital signal outputted by the digital quadrature modulator 111. The D-A converter can be any suitable D-A converter, such as, for example, a model DAC600 available from Burr-Brown.

Further, the FPGA can be programmed to monitor check bits that are interleaved in the data of the in-phase and quadrature signals provided by the predistorter and interpolator. In this embodiment, the DSP module implementing the predistorter is programmed to interleave the check bits with the in-phase and quadrature data outputted by the predistorter. The check bits are used to detect if the data flow in the transmitter becomes incorrectly synchronized (e.g., large fields, power surges, static discharge, etc. may cause misclocking between in-phase and quadrature signals). If the in-phase and quadrature signals get out of synch, then the transmitter output signals will be severely distorted. The FPGA of the digital quadrature modulator compares the check bits between corresponding in-phase and quadrature signals and if they do not match, then the digital quadrature modulator causes the transmitter to be disabled and reset, either directly or by signaling the controller 238 (FIG. 2), which then disables and resets the transmitter.

In addition, when the predistorter output signals are correctly clocked, the FIFOs 501 and 505 are approximately half filled. Thus, any overflow or underflow condition in the FIFOs 501 and 505 is indicative of a serious clock fault. Thus, if one or both of the FIFOs indicate an overflow or underflow condition, the digital quadrature modulator again indicates a fault condition to disable and reset the transmitter.

Figure 6:
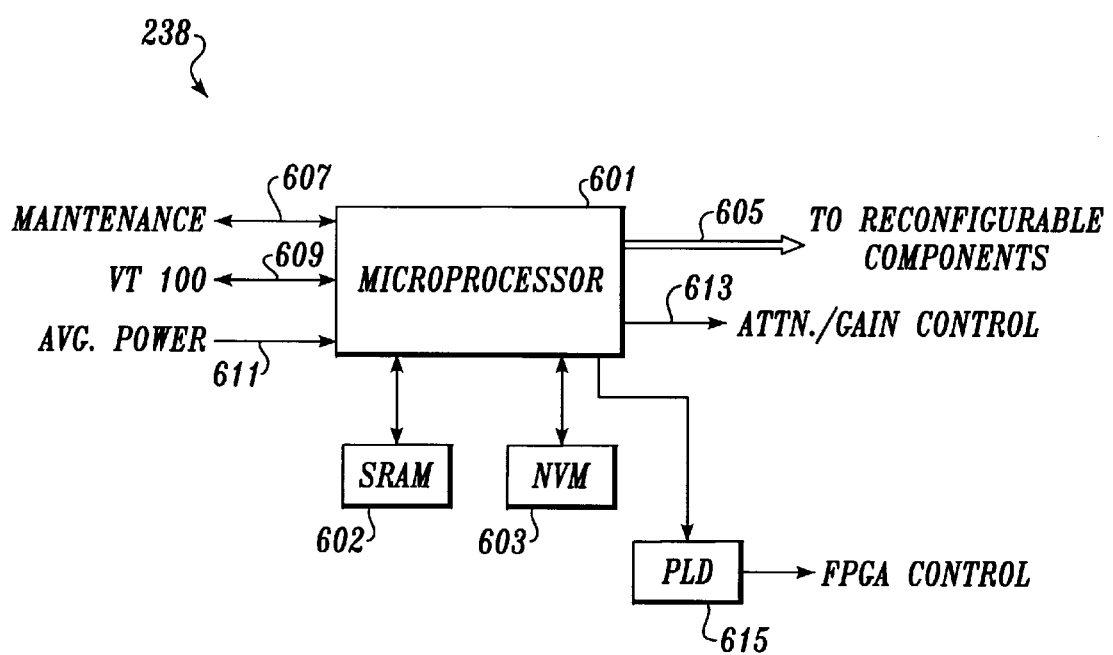
FIG. 6 is a block diagram of one embodiment of a controller according to the present invention.

FIG. 6 is a block diagram of one embodiment of the controller 238 according to the present invention. The controller 238 includes a microcontroller 601 connected to a SRAM 602 and a nonvolatile memory 603. In the preferred embodiment, the microcontroller 601 is a Motorola MC68HC16 microcontroller, although any suitable microcontroller can be used. The microcontroller 601 is connected to a global bus 605, which is also connected to the reconfigurable components of the transmitter 200 (FIG. 2), such as the digital modulator 103, the interpolator 205, the predistorter 107 and the digital decimator 229. The controller 238 provides reconfiguration information to the reconfigurable components through the global bus 605.

The microcontroller 601 also includes a maintenance port 607. The maintenance port can be configured as either an EIA-232 or EIA-422 interface. The maintenance port 607 can be used to receive information from an external source as described in the data sheet for the MC68HC16, which is incorporated herein by reference. Thus, by coupling a remote communication device, such as a modem, to the maintenance port 607, the controller 238 can receive reconfiguration information remotely communicated to the controller, which can be used to reconfigure the various reconfigurable components of the transmitter 200 (FIG. 2). In addition, the microcontroller 601 can receive the FFT information from the trainer 131 (described above in conjunction with FIG. 4) through the global bus 605 and provide this FFT information to the maintenance port 607 for remote monitoring of the transmitted spectrum.

In this embodiment, the microcontroller 601 also includes a port 609 for connecting to a VT100 terminal for monitoring, testing and troubleshooting. In addition, the microcontroller 601 includes input and output ports 611 and 613, respectively, for receiving the average power signals and for adjusting the gain and attenuation of the analog downconverter and analog upconverter, as described above in conjunction with FIG. 2. A programmable logic device (PLD) 615 such as, for example, a ATV2500B PLD is also connected to the microcontroller 601 and provides control signals to the FPGAs in the digital quadrature modulator and the digital quadrature demodulator.

In addition, the microcontroller 601 can be programmed to provide control signals to the digital quadrature modulator 111 and digital quadrature demodulator 125 (FIG. 2) on power up and reset to force synchronization between the digital quadrature modulator 111 and digital quadrature demodulator 125.

Figure 7:
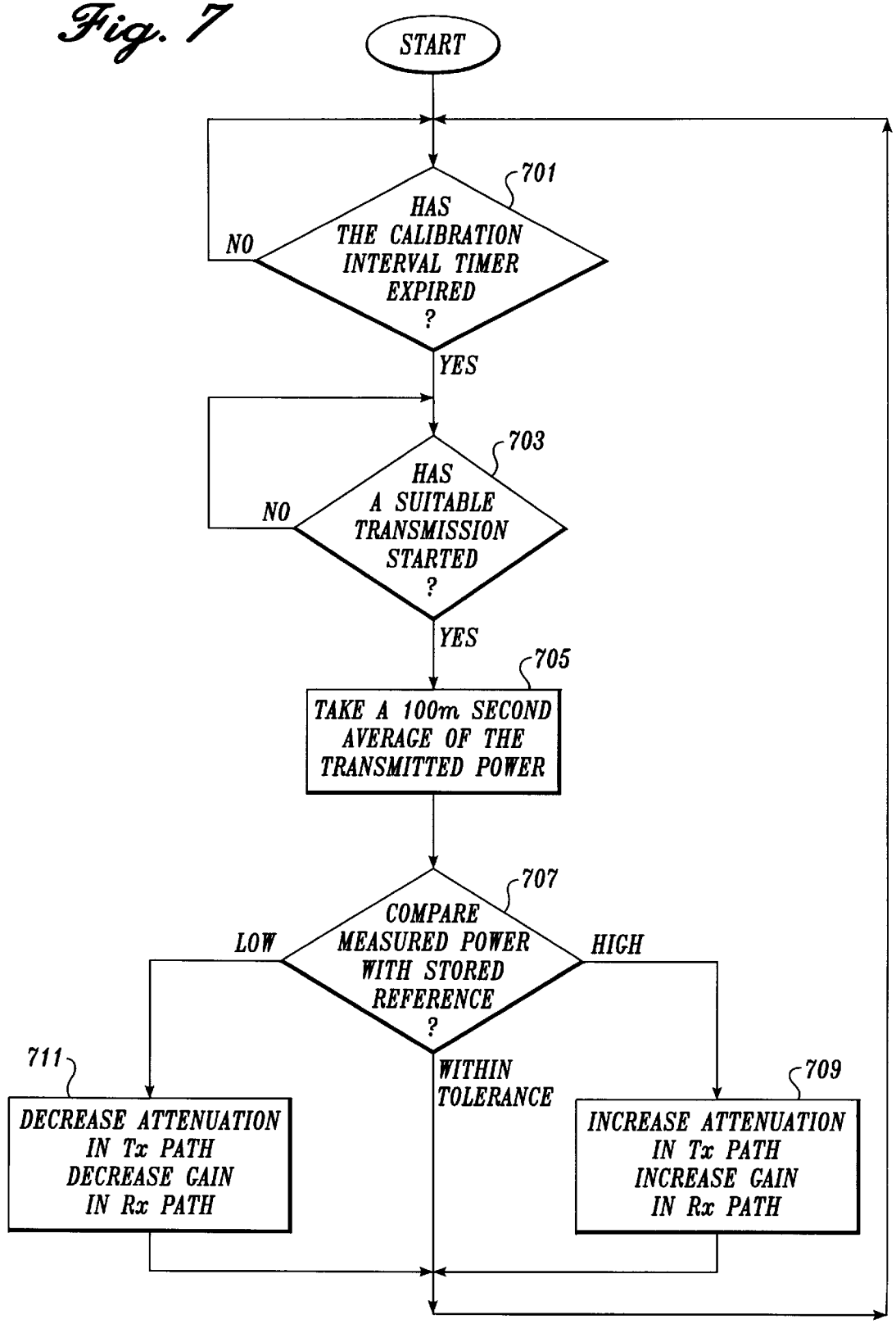
FIG. 7 is a flow diagram illustrating the operation of the controller in automatically adjusting the gain and attenuation of the analog downconverter and analog upconverter, respectively, according to one embodiment of the present invention.

FIG. 7 is a flow diagram illustrating the operation of the controller 238 (FIG. 2) in automatically adjusting the attenuation and gain of the analog upconverter 113 and analog downconverter 123 (FIG. 2). The controller 238 performs this calibration periodically by checking whether a calibration interval timer has expired, as shown in step 701. In the preferred embodiment, the interval is approximately ten minutes. The controller repeats checking the calibration timer until the interval has expired, and then performs a step 703.

In step 703, the controller 238 checks whether the transmitter 200 (FIG. 2) has started a transmission suitable for use in the calibrating process. Suitable transmissions are those that have an approximately constant power level such as, for example, FSK modulated signals. QAM signals can also be suitable. Normal digital data transmissions are typically suitable, although voice transmissions are not. If a suitable transmission has not started, then the controller 238 repeats step 703 until one does begin.

The controller 238 then performs a step 705 where it takes a 100 µs average of the transmitted power. The controller 238, in a next step 707, compares the measured average power with a stored reference. In the preferred embodiment, the stored reference is the average power of a test tone transmitted at the time of manufacture. If the measured average power is greater than the reference, then in a step 709 the controller 238 causes the analog upconverter 113 to increase its attenuation and the analog downconverter 123 to decrease its gain, as described above in conjunction with FIG. 2. In contrast, if the measured average power is less than the reference, then in a step 711 the controller 238 causes the analog upconverter 113 to decrease its attenuation and the analog downconverter 123 to increase its gain. However, if the measured average power is approximately equal to the reference (i.e., within tolerance), then the controller 238 does not modify the attenuation or gain of the analog upconverter or downconverter. The controller 238 then loops back to step 701 to wait for the next calibration interval to expire.

Figure 8:
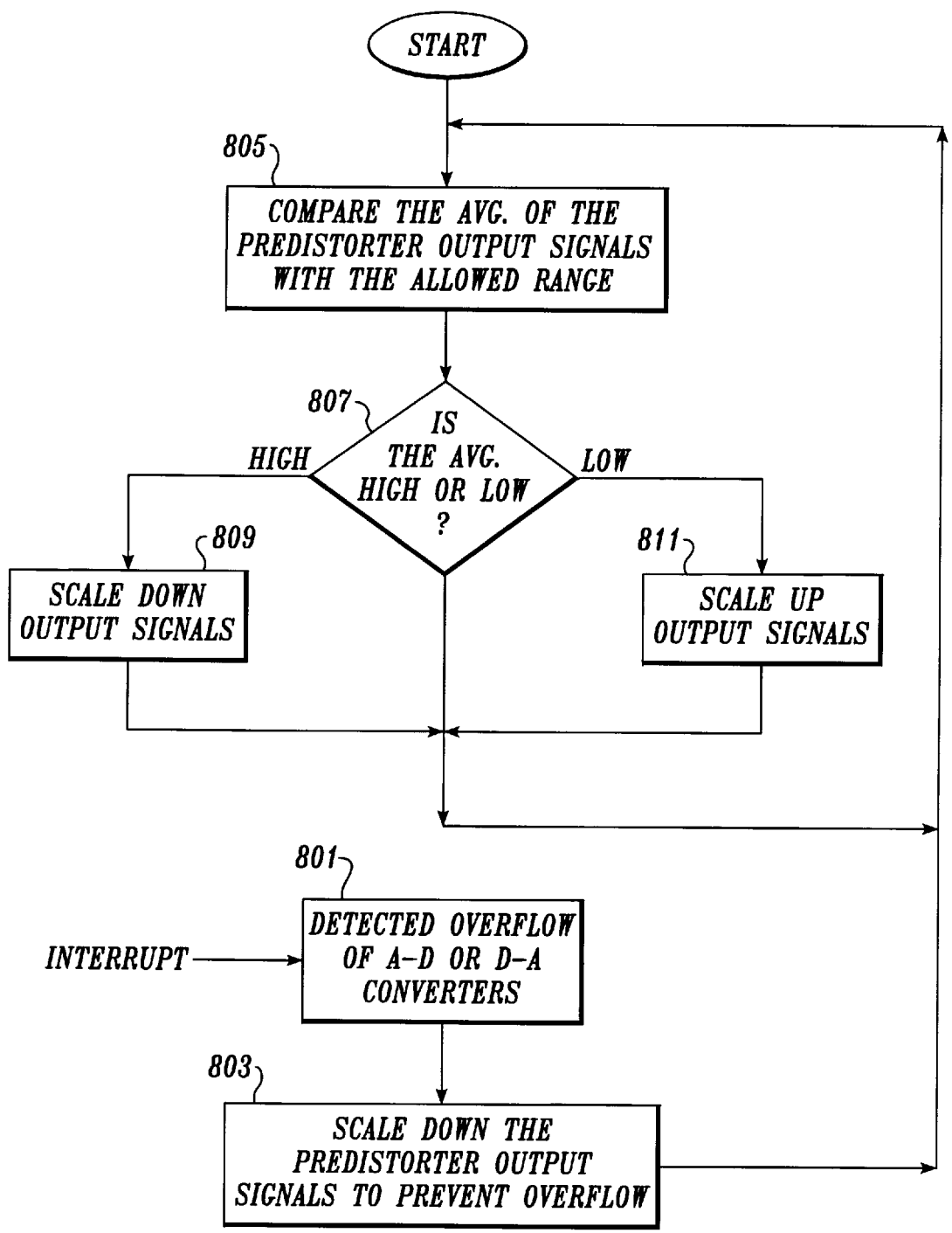
FIG. 8 is a flow diagram illustrating the operation of the predistorter in automatically maintaining a maximal dynamic range of signals passing through the transmitter accord to one embodiment of the present invention.

FIG. 8 is a flow diagram illustrating the operation of the predistorter 107 (FIG. 2) implemented with a DSP module (FIG. 4) in automatically maintaining a maximal dynamic range of signals passing through the transmitter 200 (FIG. 2). The predistorter 107 is coupled to receive an interrupt signal from the digital quadrature modulator 111 and the digital quadrature demodulator 125 whenever an overflow condition has occurred (i.e., the dynamic range has been exceeded). An interrupt causes the predistorter 107 to perform a step 801, indicating an overflow was detected in the A-D converter or the D-A converter (FIG. 2). The predistorter 107 then performs a step 803 to scale down the predistorter output signals to prevent overflow of subsequent signals. Then, in a next step 805, the predistorter 107 compares the average amplitude of the predistorter output signals to the allowed range of the D-A and A-D converters. In a next step 807, an evaluation is made of whether the average amplitude is higher than the allowed range. If so, the predistorter scales its output signals down in a step 809. However, if in step 807 the average amplitude is determined to be lower, then in a step 811 the predistorter scales its output signals up. The predistorter 107 then returns to step 805, repeating the cycle until the next interrupt.

Figure 9:
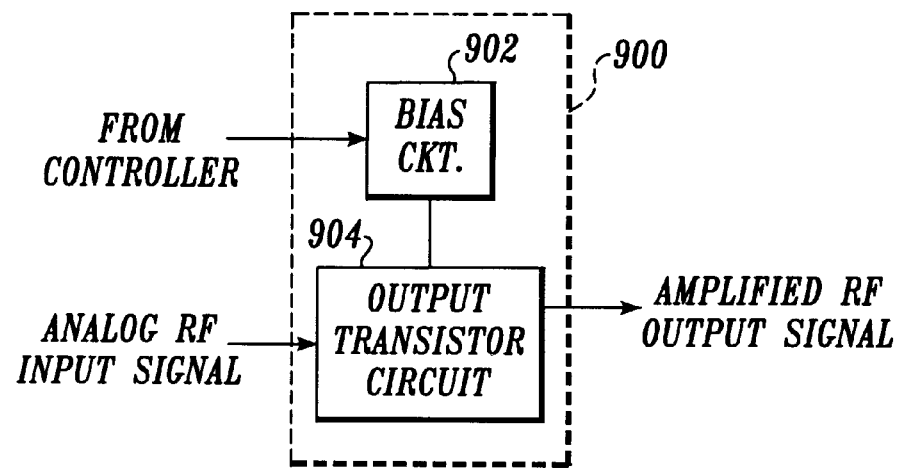
FIG. 9 is a block diagram of a power amplifier according to one embodiment of the present invention.

FIG. 9 is a block diagram of a power amplifier 900 according to one embodiment of the present invention. The power amplifier 900 includes a bias circuit 902 that provides a configurable bias level to an output transistor circuit 904. The output transistor circuit 904 is also coupled to receive an analog RF input signal during a transmit period. The current conducted by the output transistor circuit 904 is a function of the analog signal and the bias level provided the bias circuit 902.

Unlike the bias circuits for conventional transmitter power amplifiers, the bias circuit 902 is configurable to provide to the output transistor circuit 904 a preheat bias level during a preheat period and a normal bias level during the transmit period. For example, when the output transistor circuit 904 is a MOSFET-type transistor, the bias circuit 902 provides a bias voltage to the output transistor's gate. In accordance with the present invention, the bias voltage provided during the preheat period is different from the bias voltage provided during transmit periods (during which the power amplifier 900 amplifies a RF signal to be transmitted). Consequently, the output transistor circuit 904 conducts a substantially constant DC current during the preheat period compared to the varying current of normal transmitting operation during the transmit period. As is well known, the junction temperature of a MOSFET, in general, depends on the drain current conducted by the MOSFET. The preheat bias level is predetermined so that the resulting DC drain current conducted by the MOSFET causes the MOSFET to have a junction temperature substantially equal to the MOSFET's steady-state junction temperature under normal biasing while amplifying an RF input signal.

For example, when the power amplifier 900 is in a class AB configuration, as is well known in the art of RF amplifiers, the average power dissipated in the output transistor of the power amplifier ($P_{ABdiss}$) is:

$$P_{ABdiss} = P_{ABsupplied} - P_{ABoutput} \tag{1}$$

where $P_{ABsupplied}$ is the total average power supplied by the power supply to the output transistor and $P_{ABoutput}$ is the average RF power transmitted. $P_{ABoutput}$ also includes all of the losses in the output circuitry connecting the output transistor to the antenna, as well as the power actually transmitted out of the antenna.

The relationship between $P_{ABoutput}$ to $P_{ABsupplied}$ is denoted herein as η. Thus, the average power dissipated in the output transistor during class AB operation can be expressed as follows.

$$P_{ABdiss} = (1-\eta)P_{ABsupplied} \tag{2}$$

Also, $P_{ABsupplied}$ can be expressed in terms of the drain power supply voltage ($V_{supplied}$) and the average current conducted by the output transistor from this supply ($I_{ABsupplied}$) as follows.

$$P_{ABdiss} = (1-\eta)I_{ABsupplied}V_{supplied} \tag{3}$$

Further, as is also well known, when conducting a constant DC current with no RF input signal, a transistor dissipates power ($P_{DCdiss}$) according to the equation:

$$P_{DCdiss} = I_{DCsupplied}V_{supplied} \tag{4}$$

where $I_{DCsupplied}$ is the DC current conducted by the output transistor. In this case, all power supplied is dissipated in the transistor.

In general, the steady-state junction temperature of a transistor is related to the power dissipated by the transistor. Thus, the junction temperature during the preheat period will be substantially equal to the junction temperature during the transmit period when the dissipated powers are equal; i.e., when:

$$I_{DCsupplied}=(1-\eta)I_{ABsupplied} \qquad (5)$$

Thus, when η is equal to 0.35, then the output transistor should be biased to conduct a constant DC current that is about 0.65 times the DC current conducted by the output transistor during the transmit period. The pre-heating bias current is lower than the transmit bias current because all of the power is dissipated in the transistor. Under normal bias and while amplifying a signal, power is transmitted out through the antenna and the power dissipated in the transistor is due to the inefficiency of the amplifier. Under more ideal conditions, the power dissipated in the transistor would be lower (i.e., η is higher) and the DC preheating bias current would therefore be correspondingly lower.

The power amplifier 900 operates as follows. The bias circuit 902 receives control signals from a controller (e.g., the controller 238 depicted in FIG. 2) to switch between providing the preheat bias level and the normal bias level. In this embodiment, the controller is configured to detect when a transmission will begin and, in response, to start the preheat period as the transmit data is processed by the transmitter. The controller starts the preheat period so that the preheat period ends slightly before the transmit data is ready to be transmitted. Thus, the MOSFET is preheated so that the output transistor circuit 904 already has this steady-state junction temperature by the time the transmit period begins. This early start of the preheat period preheats the power amplifier so that the transmitter can immediately transmit the data without the thermal distortion and key-up period of conventional power amplifiers. Moreover, this system avoids training on the key-up distortion, further improving the performance of the system.

In addition, in this embodiment, the controller ensures that the transmitter does not provide a RF signal the power amplifier 900 during preheat. Accordingly, the transmitter does not transmit any energy because the DC output signal of the output transistor circuit 904 has, in effect, a frequency of zero and is not coupled to the antenna through the output capacitor coupling the power amplifier to the antenna. Thus, the transmitter does not transmit any signals during preheat.

Figure 9A:
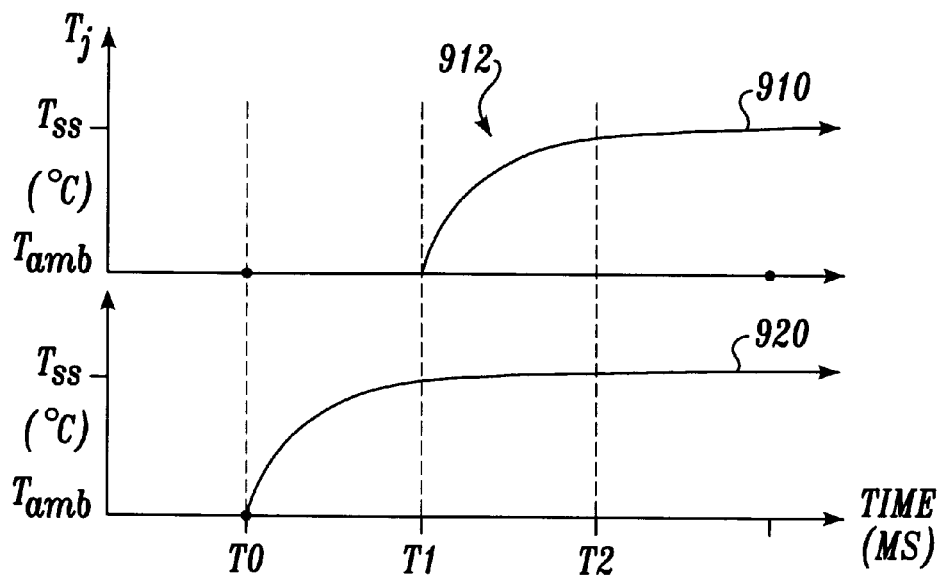

FIG. 9A is a graph illustrating the timing of the junction temperature rising from ambient for the output transistor circuit 904 (FIG. 9). The curve 910 illustrates the junction temperature of the output transistor circuit 904 as a function of time during the transmit period, without a preceding preheat period. The curve 910 has a segment 912 between times T1 and T2 during which the junction temperature rises, finally leveling off to approach the steady-state junction temperature. Signals amplified between times T1 and T2 suffer from the aforementioned thermal distortion.

In contrast, the curve 920 illustrates the junction temperature of the output transistor circuit 904 with a preheat period started at time T0. As described above in conjunction with FIG. 9, in accordance with the present invention, the preheat biasing causes the output transistor circuit 904 to reach and maintain a steady-state junction temperature during the preheat period that is substantially equal to the output transistor's steady-state junction temperature while transmitting during the transmit period. The preheat period is started so that the preheat steady-state junction temperature is reached by the time a signal is ready to be transmitted (i.e., at time T1). Because the output transistor circuit 904 is already at the steady-state junction temperature at time T1, signals amplified between times T1 and are not thermally distorted.

In an alternative embodiment, the controller may cause the preheat period to be the "default" condition. More specifically, in this embodiment the controller causes the bias circuit 902 (FIG. 9) to continually provide the preheat bias level to the output transistor circuit 904 (FIG. 9) until a signal to be transmitted is received by the power amplifier 900. When a signal to be transmitted is received by the power amplifier 900, the controller then causes the bias circuit 902 to provide the normal bias level to the output transistor in the output transistor circuit 904. Because the bias circuit 902 continually provides the preheat bias level to the output transistor circuit 904 when the power amplifier 900 is not transmitting, the output transistor circuit 904 is ensured to have a junction temperature substantially equal to the output transistor's junction temperature under normal biasing while transmitting during the transmit period.

Figure 10:
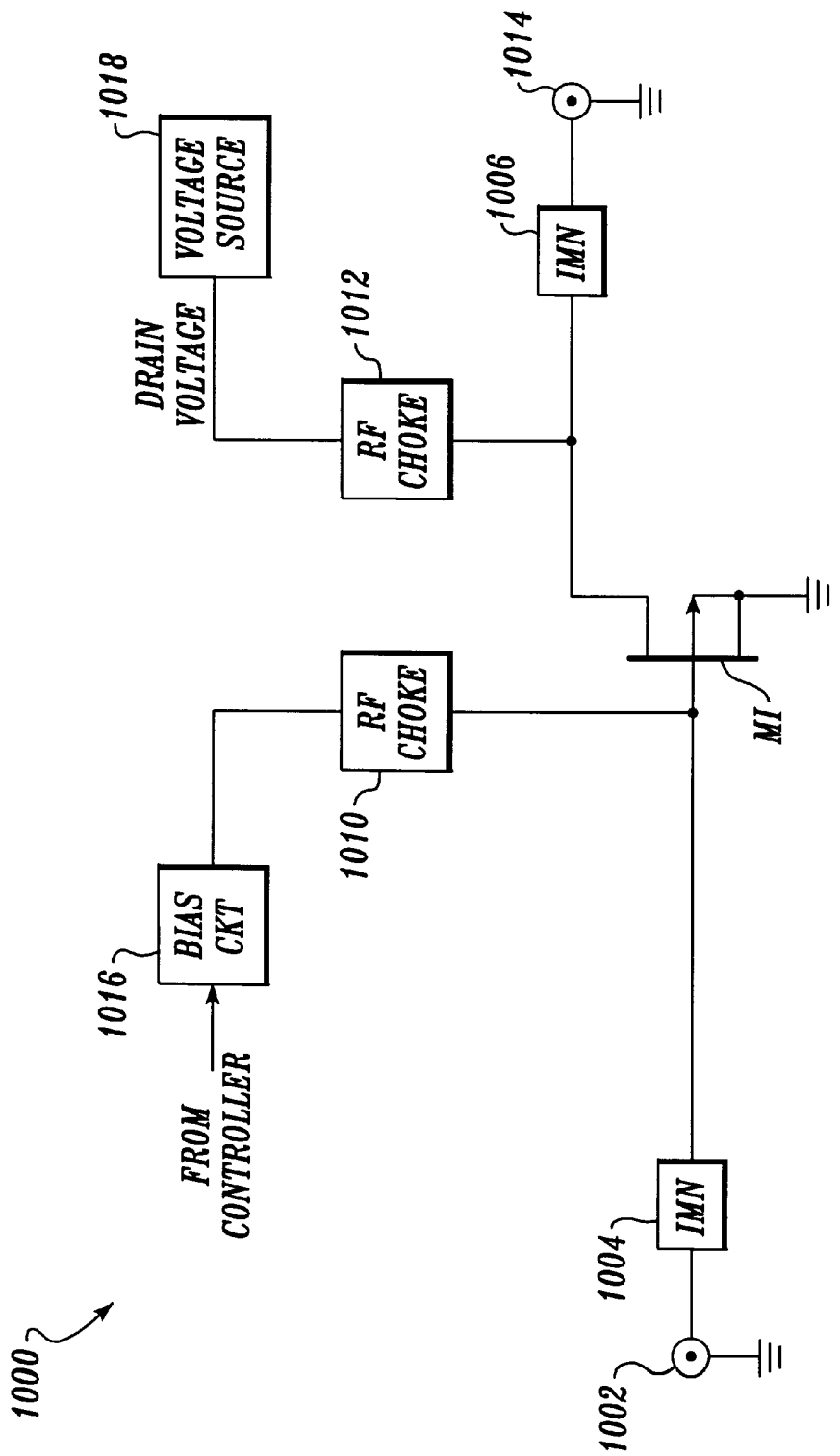
FIG. 10 is an electrical circuit diagram of a power amplifier according to one embodiment of the present invention.

FIG. 10 is an electrical circuit diagram of an implementation of the power amplifier 1000 according to another embodiment of the present invention. In this embodiment, the power amplifier 1000 includes an input terminal 1002, conventional impedance matching networks (IMNs) 1004 and 1006, conventional RF chokes 1010 and 1012, an output transistor M1, an output terminal 1014, and bias circuit 1016 and a drain power supply circuit 1018.

The elements of the power amplifier 1000 are interconnected as follows. The input terminal 1002 (coaxial in this embodiment) is connected to an input lead of the IMN 1004, which serves to match the impedance seen from the input terminal 1002 to the input impedance of the gate terminal G1 of the metal-oxide-semiconductor field effect transistor (MOSFET) M1. The gate G1 is connected to receive a gate bias voltage from the bias circuit 1016 through the conventional RF choke 1010. In accordance with the present invention, the bias circuit 1016 is configurable to provide a preheat bias voltage during preheat periods and to provide a transmit or normal bias voltage during transmit periods. The bias circuit 1016 can be any suitable configurable voltage source such as, for example, a DAC, or a voltage divider circuit with switches to short circuit selected resistive elements to produce the desired voltage.

The drain D1 of the MOSFET M1 is connected to receive a drain supply voltage from the conventional drain power supply circuit 1018 through the conventional RF choke 1012. Generally, the drain power supply circuit 1018 provides the supply voltage through some decoupling circuitry to serve as the drain supply voltage. In addition, the drain D1 is connected to the input lead of the IMN 1006, which serves to match the output impedance as seen looking into the MOSFET M1 with the impedance as seen looking out to the output terminal 1014. The output lead of the IMN 1006 is connected to the coaxial output terminal 1014.

Figure 11:
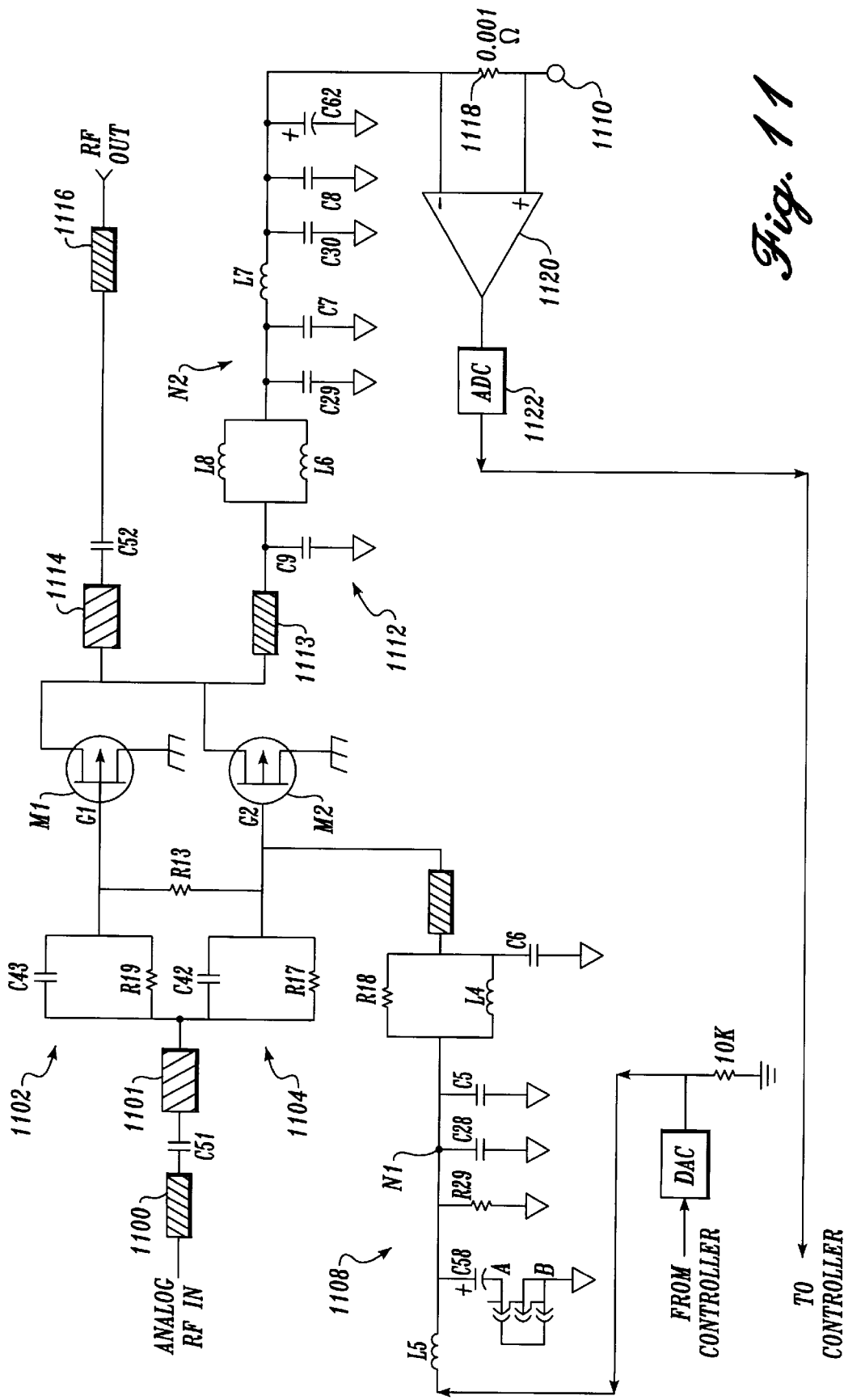
FIG. 11 is an electrical circuit diagram of a bias circuit according to one embodiment of the present invention.

FIG. 11 is a schematic diagram of a parallel FET embodiment of the power amplifier 900 (FIG. 9), in accordance with the present invention. The parallel FET configuration of the power amplifier is similar to the power amplifier disclosed in co-pending and commonly-assigned U.S. patent application Ser. No. 08/601,370 entitled "High-Power Amplifier Using Parallel Transistors", filed Feb. 14, 1996 by M. Walker.

The analog RF input signal is received by the power amplifier 900 at an IMN implemented with a microstrip transmission line 1100 connected in series with a capacitor C51, which is then connected in series with a microstrip transmission line 1101. This IMN serves to match the fifty ohm impedance of the input coaxial line with the input impedance of the RCMNs 1102 and 1104 of the power amplifier 900. The RCMNs 1102 and 1104 are each implemented with a capacitor connected in parallel with a resistor. More specifically, the RCMN 1102 is implemented with a capacitor C34 connected in parallel with a resistor R19. Similarly, the RCMN 1104 is implemented with a capacitor C42 connected in parallel with a resistor R17. The capacitors of the RCMNs 1102 and 1104 are chosen to be self-resonant at the frequency of interest.

The RCMNs 1102 and 1104 have output leads respectively connected to the gate terminals G1 and G2 of the n-channel MOSFETs M1 and M2. In addition, a resistor R13 is connected between the gate terminals G1 and G2 of the MOSFETs M1 and M2. A bias circuit 1106 is coupled to the gate terminal G1 through a RF decoupling filter circuit 1108. In this embodiment, the bias circuit 1106 is a conventional DAC.

The RF decoupling filter circuit 1108 in this embodiment is a conventional LC circuit serving to decouple RF signals from the bias circuit 972 while allowing the bias circuit 1106 to provide a DC bias voltage to the gate terminal G1. The RF decoupling filter circuit 1108 includes a microstrip transmission line 1109 having one end connected to the gate G1 and a second end coupled to the ground line through a capacitor C6. Microstrip transmission line 1109 acts to transform the self-resonant capacitor C6 to a high impedance. The second end of the microstrip transmission line 1109 is coupled to a node N1 through a resistor R18 and inductive bead L4, which are connected in parallel. A resistor R29 and capacitors C5, C28 and C58 are connected between the node N1 and the ground line. In this embodiment, the capacitor C58 is connected to the ground line through a jumper. In addition, a bead inductor L5 connects the node N1 to the output lead of the bias circuit 1106.

The source terminals S1 and S2 of the n-channel MOSFETs M1 and M2, respectively, are connected to ground. The drain terminals D1 and D2 of the MOSFETs M1 and M2 are connected together. Thus, the MOSFETs M1 and M2 are connected in parallel. The drain terminals D1 and D2 are connected by microstrip line to a drain voltage supply circuit 1110 through an RF decoupling filter circuit 1112. In addition, the drains D1 and D2 are connected by a microstrip transmission line 1114 to a first lead of a decoupling capacitor C52. The other lead of the decoupling capacitor C52 is connected by a microstrip transmission line 1116 to an output terminal.

The RF decoupling filter circuit 1112 includes an output lead coupled through a microstrip transmission line 1113 to the ground line through a capacitor C9. This microstrip line is also coupled to a node N2 through parallel-connected bead inductors L6 and L8. The node N2 is coupled to the ground line through capacitors C29 and C7. In addition, a bead inductor L7 connects the node N2 to the input lead of the RF decoupling filter circuit 1112. The RF decoupling filter circuit 1112 also includes capacitors C38, C8 and C62 connected between this output lead and the ground line.

The output lead of the RF decoupling filter circuit 1112 is coupled to the drain supply circuit 1110. In this embodiment, the drain supply circuit 1110 is simply a 28 VDC supply voltage source. In addition, a current sensing resistor 1118 is connected between the drain supply circuit 1110 and the input lead of the RF decoupling filter circuit 1112. The controller monitors the output current of the power amplifier 900 during both the preheat period and the transmit period so that the controller may adjust the preheat bias voltage so that the preheat steady-state junction temperature remains substantially equal to the transmit period steady-state junction temperature. In this embodiment, the resistor 1118 is connected between the input leads of a differential-input amplifier 1120. The output lead of the amplifier 1120 is connected to the input lead of an ADC 1122, which digitizes the output voltage of the amplifier 1120. This digital signal is representative of the current conducted by the power amplifier 900.

The power amplifier 900 operates as follows upon key-up. The bias circuit 1106 is coupled to receive a control signal from the controller (e.g., controller 238 depicted in FIG. 2) that operates to configure the bias circuit 1106 into a preheat mode in which the bias circuit 1106 provides the preheat bias voltage to the gates G1 and G2 of the MOSFETs M1 and M2. In this embodiment, the controller provides a digital signal to the bias circuit 1106, which the DAC implementing the bias circuit 1106 converts to a voltage substantially equal to the desired preheat bias voltage. As described above in conjunction with FIG. 9, the preheat bias voltage causes the junction temperatures of the MOSFETs M1 and M2 to reach a steady-state value substantially equal to the steady-state junction temperature of the transmit period (i.e., while transmitting normal data). In this embodiment, the bias circuit 1106 provides a preheat bias voltage of about five volts.

Further, in the preferred embodiment, the controller also prevents the transmitter from providing an analog RF input signal to the power amplifier 900. Because the preheat DC bias current conducted by the MOSFETs has a frequency substantially equal to zero, the power amplifier receives no AC signals. Thus, the transmitter transmits substantially no signals during the preheat period, whereby thermal distortion is substantially eliminated.

After the preheat steady-state junction temperature is reached, the controller can start the transmit period as described above in conjunction with FIG. 9. Preferably, the preheat period is started so that this steady-state junction temperature is reached at the time the transmitter is ready to transmit real data. The controller then provides a digital control signal to the bias circuit 1106, which the DAC implementing the bias circuit 1106 then converts to the transmit bias voltage. Thus, the bias circuit 1106 provides a DC bias voltage to the gate terminals G1 and G2 of the MOSFETs M1 and M2 through the RF decoupling filter circuit 1108 and the resistor R13. Similarly, the drain supply circuit 1110 provides a constant voltage to the drain terminals D1 and D2 of the MOSFETs M1 and M2 through the RF decoupling filter circuit 1112. These bias voltages are predetermined to optimize the performance of the MOSFETs. For example, in a Class AB configuration, the preheat and transmit gate bias voltages are about five and three volts, respectively.

The analog RF input signal to be amplified is propagated to the IMN implemented by the microstrip transmission lines 1100 and 1101 and the capacitor C51. In the presently preferred embodiment of the invention, this IMN matches the approximately fifty ohms impedance of the coaxial input cable to the approximately twelve ohms input impedance of the parallel RCMNs 1102 and 1104. The RF signal output by this IMN is split into two subsignals of substantially equal power. One subsignal propagates to the gate terminal G1 of the MOSFET M1, through the RCMN 1102. Similarly, the other subsignal propagates to the gate terminal G2 of the MOSFET M2, through the RCMN 1104.

The MOSFETs M1 and M2 receive the subsignals and respectively output at the drain terminals D1 and D2 an amplified signal dependent on the received subsignals. The amplified signal propagates to the IMN implemented by the capacitor C52 and the microstrip transmission lines 1114 and 1116, which matches the ¼ ohm impedance from the drain terminals of the MOSFETs M1 and M2 to the approximately fifty ohm impedance of the coaxial output cable.

Because the capacitors C43 and C42 of the RCMNs 1102 and 1104 are selected to be self-resonant at the frequency of interest, the resistors R19 and R17 appear to be shorted when amplifying the analog RF input signal. Therefore, the analog RF input signal is not significantly attenuated in reaching the gate terminals G1 and G2 of the MOSFETs M1 and M2. Accordingly, the MOSFETs M1 and M2 provide an output signal of more power compared to a conventional parallel-transistor power amplifier receiving the same input RF signal.

At frequencies below the frequency of interest, the resistors R19 and R17 dominate the input impedance of the amplifier and greatly attenuate the input RF signal in reaching the gate terminals G1 and G2 of the MOSFETs M1 and M2. Similarly, at frequencies above the frequency of interest, the inductive effects of the lines or wires propagating the input RF signal greatly attenuate the input RF signal in reaching the MOSFETs M1 and M2. By proper selection of the capacitors C43 and C42 and the resistors R19 and R17, the power amplifier 900 can be tailored to have a narrow band of operation.

The resistor R13, connected between the gate terminals G1 and G2 of the MOSFETs M1 and M2, serves to prevent odd mode oscillations. Preferably, the resistor R13 is selected so that the parallel MOSFET circuit presents a lossy input impedance to the subsignals from the RCMNs 1102 and 1104. The lossy impedance is achieved by selecting the resistance of the resistor R13 to have a value that is several times the value of the input impedance of the MOSFETs M1 and M2.

In selecting the value of the resistor R13, if the value of the resistor R13 is too great, then the parallel MOSFET circuit presents a "virtual" open circuit between the gate terminals G1 and G2 and, thus, the resistor R13 will have no effect in diverting the alternating gate currents that occur during odd mode oscillations. However, if the value of the resistor R13 is too small, then the resistor R13 will appear as a virtual short in the parallel MOSFET circuit and, thus, the resistor's inductive effects will change the frequency at which the odd mode oscillations occur without significantly attenuating the odd mode oscillations. In the presently preferred embodiment of the invention, the value of the resistor R13 is selected to be between two and ten times the gate-to-source impedance of either MOSFET. When amplifying the analog RF input signal, the bypass resistor R13 has no significant effect because the voltage at either side of the resistor R13 is substantially identical and, thus, no current flows through the resistor.

Preferably, for transmitting signals having a frequency range of about 900–960 MHz, the MOSFETs M1 and M2 are model MRF 184 transistors, available from Motorola. Each of these MOSFETs has an input impedance of approximately ½ ohms. The bypass resistor R13 is selected to have a resistance of approximately six ohms. The RCMNs 1102 and 1104 are each implemented with a fifteen ohm resistor connected in parallel with a thirty-nine picofarad capacitor.

This embodiment of the power amplifier 900 provides high power due to the parallel combination of the MOSFETs but, due to the presence of the bypass resistor R13, does not suffer from odd mode oscillation. Further, the RCMNs 1102 and 1104 act as short circuits at the frequency of interest, thereby reducing or eliminating the attenuation associated with series-resistive matching networks used in some conventional power amplifiers.

The embodiments of the power amplifier and transmitter described above are illustrative of the principles of the present invention and are not intended to limit the invention to the particular embodiments described. For example, while a preferred embodiment has been described in connection with a paging transmitter, the linear transmitter will find application in many broadcast environments. In addition, the embodiments described above can be adapted for different modulation formats without undue experimentation by those skilled in the art, in light of the present disclosure. For example, voice signals modulated by AM SSB can also be supported, as well as multiple subcarriers of such modulated signals. Further, although the power amplifier is described having parallel MOSFETs in the output stage, other embodiments may have fewer or more MOSFETs. Still further, JFETs or even bipolar transistors may be used in other embodiments. In other embodiments, the bias circuits can be adapted to provide bias levels that are better characterized as currents instead of voltages. Accordingly, while the preferred embodiment of the invention has been illustrated and described, it will be appreciated that in light of this disclosure, various changes can be made therein without departing from the spirit and scope of the invention.

The embodiments of the invention in which an exclusive property or privilege is claimed are defined as follows:

1. A power amplifier for use in a transmitter, the power amplifier comprising:
   an output transistor having an input lead and an output lead; and
   a bias circuit coupled to said input lead of said output transistor, wherein said bias circuit is configured to provide a first bias level to said output transistor when said transmitter is operating in a preheat period and to provide a second bias level when said transmitter is transmitting in a transmit period, wherein said output transistor is operative to generate substantially equal heat in said preheat period and said transmit period.

2. The power amplifier of claim 1 wherein said output transistor is operative to generate substantially equal heat in said preheat period and said transmit period.

3. The power amplifier of claim 2 wherein said bias circuit comprises a switch circuit configured to couple said first bias level to said input lead of said output transistor when said preheat period begins and to uncouple said first bias level from said input lead of said output transistor when said preheat period ends.

4. The power amplifier of claim 2 wherein said power amplifier is configured to provide RF power amplification when said preheat period ends.

5. The power amplifier of claim 2 wherein said output transistor provides during said preheat period a substantially DC output signal at said output lead of said output transistor, whereby said transmitter transmits substantially no signals.

6. The power amplifier of claim 5 further comprising a capacitor configured to couple said output lead of said output transistor to an antenna of said transmitter.

7. The power amplifier of claim 2 wherein said output transistor forms part of a class AB output stage of said power amplifier.

8. The power amplifier of claim 2 wherein said first bias level causes said output transistor to conduct a first bias current that is different from a second bias current conducted by said output transistor in response to said second bias level.

9. The power amplifier of claim 8 wherein said first and second bias levels are DC voltages.

10. The power amplifier of claim 9 wherein said first bias level is greater than said second bias level.

11. A transmitter comprising:
a modulator coupled to receive an input signal, said modulator configured to output a modulated carrier signal dependent on said input signal;
a predistorter coupled to said modulator, said predistorter configured to output a predistorted signal dependent on said modulated carrier signal from said modulator;
a power amplifier coupled to said predistorter, said power amplifier configured to output an amplified signal dependent on said predistorted signal from said predistorter, wherein said power amplifier comprises:
an output transistor having an input lead and an output lead, and
a bias circuit coupled to said input lead of said output transistor, wherein said bias circuit is configured to provide a first bias level to said output transistor when said transmitter is operating in a preheat period and to provide a second bias level when said transmitter is transmitting in a transmit period; and
a trainer coupled to power amplifier and said predistorter, said trainer configured to provide to said predistorter a training signal dependent on said amplified signal from said power amplifier,
wherein said predistorter is operative to introduce distortion to said modulated signal from said modulator substantially canceling distortion introduced by said power amplifier when said transmitter is transmitting.

12. The power amplifier of claim 11 wherein said output transistor is operative to generate substantially equal heat in said preheat period and said transmit period.

13. The power amplifier of claim 12 wherein said bias circuit comprises a switch circuit configured to couple said first bias level to said input lead of said output transistor when said preheat period begins and to uncouple said first bias level from said input lead of said output transistor when said preheat period ends.

14. The power amplifier of claim 12 wherein said output transistor provides during said preheat period a substantially DC output signal at said output lead of said output transistor, whereby said transmitter transmits substantially no signals.

15. The power amplifier of claim 14 further comprising a capacitor configured to couple said output lead of said output transistor to an antenna of said transmitter.

16. The power amplifier of claim 12 wherein said output transistor forms part of a class AB output stage of said power amplifier.

17. The power amplifier of claim 12 wherein said first and second bias levels are DC voltages.

18. A power amplifier for use in an RF transmitter, the power amplifier comprising:
an output transistor having an input lead coupled to receive a RF input signal; and
biasing means for providing a first bias level to said output transistor when said transistor is operating in a preheat period and to provide a second bias level when said transmitter is transmitting in a transmit period, wherein said biasing means is configured to provide said first and second bias levels so that said output transistor generates substantially equal heat in said preheat period and said transmit period.

19. The power amplifier of claim 18 wherein said biasing means is configured to provide said first and second bias levels so that said output transistor generates substantially equal heat in said preheat period and said transmit period.

20. A method of reducing key-up time in a transmitter, said transmitter having a power amplifier and being configured to operate in a preheat period and a transmit period, said method comprising:
biasing said power amplifier with a first bias level during said preheat period; and
biasing said power amplifier with a second bias level during said transmit period,
wherein said first bias level causes a temperature of a semiconductor junction of said power amplifier to increase to a temperature approximately equal to a steady-state temperature of said semiconductor junction when said transmitter is transmitting during said transmit period.

21. The method of claim 20 wherein said semiconductor junction is part of an output transistor of said power amplifier, said output transistor being configured to conduct a different bias current in response to said second bias level than said first bias level.

22. The method of claim 20 wherein said biasing said power amplifier with a first bias level during said preheat period comprises conducting a DC current through an output transistor of said power amplifier, wherein substantially no RF signal is transmitted by said transmitter during said preheat period.

23. The method of claim 20 wherein said first and second bias levels are DC voltages.

* * * * *

UNITED STATES PATENT AND TRADEMARK OFFICE
CERTIFICATE OF CORRECTION

PATENT NO. : 5,920,808
DATED : July 6, 1999
INVENTOR(S) : D.E. Jones et al.

It is certified that error appears in the above-identified patent and that said Letters Patent is hereby corrected as shown below:

On the title page, item

[56]  Refs. Cited       "4,654,672  3/1987" should read
      (U.S. Pats.,      --5,654,672  8/1997--
      item 2)

Signed and Sealed this

Fourth Day of January, 2000

Attest:

Attesting Officer       *Acting Commissioner of Patents and Trademarks*